United States Patent [19]

Fukushima et al.

[11] Patent Number: 5,508,252
[45] Date of Patent: Apr. 16, 1996

[54] BI OXIDE SUPERCONDUCTORS

[75] Inventors: Noburu Fukushima; Hiromi Niu, both of Tokyo; Ken Ando, Kanagawa, all of Japan

[73] Assignee: Kabushiki Kaisha Toshiba, Kawasaki, Japan

[21] Appl. No.: 261,253

[22] Filed: Jun. 14, 1994

Related U.S. Application Data

[63] Continuation of Ser. No. 870,226, Apr. 20, 1992, abandoned, which is a continuation of Ser. No. 627,752, Dec. 14, 1990, abandoned.

[30] Foreign Application Priority Data

Feb. 13, 1990 [JP] Japan ......................... 2-31850
Mar. 30, 1990 [JP] Japan ......................... 2-83205

[51] Int. Cl.$^6$ ......................... H01B 12/00; H01L 39/12
[52] U.S. Cl. ......................... 505/121; 505/125; 505/782; 505/784; 252/521; 423/604
[58] Field of Search ......................... 252/521; 423/604; 505/100, 782, 784, 121, 125

[56] References Cited

U.S. PATENT DOCUMENTS

| | | | |
|---|---|---|---|
| 4,880,771 | 11/1989 | Cava et al. | 505/1 |
| 5,126,316 | 6/1992 | Sleight et al. | 505/782 |
| 5,389,603 | 2/1995 | Batlogg et al. | 505/782 |

FOREIGN PATENT DOCUMENTS 9008740  9/1990  WIPO.

OTHER PUBLICATIONS

Hervieu "Crystal Boundaries and Extended Defects in the 79K Superconductor . . . " *Mat'ls Sci. and Eng.* v. B6 Jul. 1990 pp. 211–219.
Retoux "Zero resistance near 80K in the bismuth lead cuprates . . . " *Modern Phys. Letts B* v. 3(7) May 10, 1989 pp. 591–595.
Zandbergen "New Superconductors . . . (Bi,Pb)$_2$Sr$_2$YCu$_2$O$_{8+x}$" *Physica C* 166 Mar. 15, 1990 pp. 282–288.
Zandbergen "Structure and properties of (Bi,Pb)$_2$Sr$_2$(Ca,Y)Cu$_3$O$_{8+y}$" *Physica C* v. 168 Jun. 15, 1990 pp. 426–449.
Fukushima "Structural modulation and superconducting . . . " *Physica C* v. 159 1989 pp. 777–783.
Manthiram "Vanishing of superconductivity at a transition . . . " *Appl. Phys. Lett.* v. 53(26) Dec. 26, 1988 pp. 2695–2697.
Tallon, "Enhancing T$_c$ in Bi$_{2.1}$CaSr$_2$Cu$_3$O$_8$ from 90 to . . . " *Appl. Phys. Lett.* v. 54(16) Apr. 17, 1989 pp. 1591–1593.
Goodenough "Evidence for some suppression . . . " *Physica C* v. 157 Mar. 1, 1989 pp. 439–445.
Ohhashi, "Bi–Sr–Ca–Cu O . . . " *Funtai Oyobi Funmatsu Yakin* v. 36(5) Jul., 1989 pp. 474–477.
*Japanese Journal of Applied Physics*, vol. 27, No. 9, Sep. 1988, pp. L1620–L1622, T. Den et al, "The superconductivity in the Bi–Sr–Ln–Cu–O system".
*Superconductor Science and Technology*, vol. 1, Aug. 1988, pp. 137–140, M. A. Lusk et al, "The fabrication of a ceramic superconducting wire".
Proceeding of MRS International Meeting in Tokyo, May 30–Jun. 3, 1988, "Preparation and Superconducting Properties of Bi–Sr–Ca–Cu Oxides Abstract" Hiromi Niu, Noburu Fukushima, Hisashi Yoshino and Ken Ando.
North–Holland Physics Publishing, Physica C 159 (1989) pp. 777–783.
*Physica C*, vol. 165, No. 1, Jan. 1, 1990, pp. 55–61, W. A. Groen et al "Hole concentration and Tc in Bi2Sr2CaCu2O8+d".
*Applied Physics Letters*, vol. 56, No. 5, Jan. 29, 1990, pp. 487–489, P. Somasundaran et al, "Occurence of maximum Tc at an optional carrier concentration in superconducting bismuth and thallium cuprates" *Appl. Phys. Lett* 56(5) 29 Jan. 1990 pp. 487–489.

*Primary Examiner*—Linda Skaling Therkorn
*Assistant Examiner*—M. Kopec
*Attorney, Agent, or Firm*—Oblon, Spivak, McClelland, Maier, & Neustadt

[57] ABSTRACT

A substance which has a Cu—O plane containing crystal structure in its unit cell and which is called a Bi oxide superconductor consisting essentially of Bi, Sr, Ca, Cu, and O. Not only part of Bi but also part of Sr and/or Ca of the Bi oxide superconductor is substituted for Pb and rare earth elements (RE), respectively. The Pb substitution relaxes the structural modulation which is closely related to superconductivity of the Bi oxide superconductor and the RE substitution controls its carrier concentration. Accordingly, superconducting properties such as transition temperature and critical current density can be improved remarkably. In addition, not only oxide superconductors with excellent superconductivity can be prepared in a low oxygen content but also the surface condition of the prepared superconductors is stable.

7 Claims, No Drawings

BI OXIDE SUPERCONDUCTORS

This application is a continuation of application Ser. No. 07/870,226, filed on Apr. 20, 1992, now abandoned, which is a continuation of 07/627,752, filed Dec. 14, 1990, now abandoned.

BACKGROUND OF THE INVENTION

1. Field of the Invention

This invention relates to Bi oxide superconductors.

2. Description of the Related Art

Oxide superconductors have recently been considered a potential as a high transition temperature (Tc) superconductor. Among them, a so-called Bi oxide superconductor consisting essentially of Bi—(Sr,Ca)—Cu—O exhibits an extremely high Tc with comparatively good stability to external environment such as moisture. In addition, its nontoxic property incontradistinction with Tl oxide superconductors is an advantage that makes its industrial applicability still higher.

It is known that the Bi oxide superconductor comes in three types depending on the length of the c-axis: 24 Å phase (Tc=about 8K); 30 Å phase (Tc=about 80K); and 36 Å phase (Tc=about 110K). These three types of Bi oxide superconductors are known to have one, two, and three planes, each plane consisting of copper and oxygen ions (Cu—O plane) per unit cell, respectively.

Tl oxide superconductors represented by a formula: $Tl_mBa_2Ca_{n-1}Cu_nO_y$ (where m is 1 or 2; n is the number of Cu—O planes per unit cell which is 1, 2, or 3), has a crystal structure substantially identical to that of the above Bi oxide superconductors, and are reported to have a Tc of about 20K with n=1. Also, a Tc of about 90K with n=2 and a Tc of about 120K with n=3 have been reported.

As revealed by these examples, it has been said that the number of Cu—O planes per unit cell intimately correlates with the Tc in the oxide superconductors and that the larger the number is, the higher the Tc becomes.

However, the latest research reports that the above correlation is not always strictly applied and that higher Tcs could be obtained with smaller number of Cu—O planes by changing the carrier concentration in the superconductive material. For example, it is known that $TlBa_2CuO_6$, one of the Tl oxide superconductors, which has only one Cu—O plane per unit cell, exhibits a variation in Tc from 0 to 90K depending on the oxygen content.

A similar phenomenon has been observed in the Bi oxide superconductors. It has been reported that $Bi_2Sr_2CuO_6$ (24 Å phase) exhibits an improvement of the Tc from 8 to about 20K by controlling the carrier concentration while substituting part of Sr for a rare earth element such as Nd. However, the maximum Tc thus obtained, being quite low compared to that of the $TlBa_2CuO_6$ superconductor, must be improved. It has also been revealed that the Tc value can be improved on Bi oxide superconductors of 30 Å phase represented by $Bi_2(Sr,Ca)Cu_2O_8$ by controlling the carrier concentration through substitution of part of Sr and/or Ca for rare earth elements. However, since the rate of Tc improvement is small in this system, further efforts in increasing the Tc are strongly called for.

Generally, oxide superconductors of simpler structure can be formed more easily. To obtain a superconductor in the form of thin films by such method as a sputtering method, a simple crystal structure, particularly simple in the c-axis direction in case of Bi oxide superconductors, allows easier formation. From the viewpoint of reproducibility, the best Bi oxide superconductors is of $Bi_2Sr_2CuO_6$ system whose lattice constant in the c-axis direction is smallest, followed by Bi oxide superconductors of $Bi_2(Sr,Ca)_3Cu_2O_8$ system. Thus, high quality, high Tc Bi oxide superconductive thin films will be prepared with satisfactory reproducibility only if the Tc of $Bi_2Sr_2CuO_6$ and $Bi_2(Sr,Ca)_3Cu_2O_8$ are improved. From this standpoint, further improvements in Tc superconductivity of the Bi superconductors are strongly demanded.

By the way, to obtain a long conductor using the above described Bi oxide superconductors, attempts have been made to prepare a desired wire or tape by using a superconductive powder to fill, e.g., a metal coated tube, drawing it to a predetermined diameter and shape, and then subjecting it to a thermal treatment in an oxygen containing atmosphere. Since a material for the metal coated tube must have not only good conductivity but also high oxygen content during the preparation and thermal treatment of the Bi oxide superconductor, excellent oxygen permeability is also required. In addition, the thermal treatment at high temperatures require that the material be stabile with respect to the Bi oxide superconductor. From the above points, noble metals such as silver are often used as materials for the metal coated tube.

However, the noble metals are not only expensive but also of poor mechanical properties in forming, e.g., a superconductive magnet. Copper and copper alloys which are inexpensive and have satisfactory mechanical properties are, on the other hand, susceptible to oxidation during thermal treatment in an oxygen containing atmosphere. The insufficient oxygen supply to the oxide superconductor in addition to their oxidation prevents copper and copper alloys from serving as materials suitable for obtaining the desired superconductivity.

To this end, there is a strong demand for development of the Bi oxide superconductors that exhibit excellent superconducting properties even at a sufficiently low oxygen content in a thermal treatment to reduce deterioration of the metal coated tube materials such as copper and copper alloys. Such a demand also applies not only to the preparation of superconductive wires and tapes but also to the preparation of superconductive elements by laminating an oxide superconductive thin film and a metal thin film one upon the other.

SUMMARY OF THE INVENTION

It is therefore an object of the invention to provide a Bi oxide superconductor whose Tc is further improved by increasing the Tc improvement rate while controlling the carrier concentration of the Bi oxide superconductor.

Another object of the invention is to provide a Bi oxide superconductor that exhibits excellent superconductivity even after a thermal treatment carried out in an atmosphere having a sufficiently low oxygen content.

Still another object of the invention is to provide a superconductive wire or tape that exhibits excellent superconductivity even in a thermal treatment with an oxygen content so low that a coated tube material will not be oxidized in order to allow copper and copper alloys which are inexpensive, mechanically strong, and highly conductive to be used as a coated tube material.

The Bi oxide superconductor of the invention comprises: at least one element selected from the group consisting of Bi, Pb, Sr, and Ca; RE (RE designating at least one rare earth element selected from the group consisting of Pr, Sm, Eu, Gd, Tb, Dy, Ho, Er, Tm, Yb, Lu, and Y); Cu; and O; and a crystal structure having at least one Cu—O plane per unit cell.

That is, the Bi oxide superconductor according to the invention is an improvement in superconducting properties such as Tc by not only controlling the carrier concentration through substitution of parts of Sr and/or Ca in its 24 Å phase, 30 Å phase, or 36 Å phase for RE elements, but also relaxing the structural modulation having an intimate correlation with its Tc through substitution of part of Bi for Pb.

The crystal structure of the Bi oxide superconductor has a peculiar structural modulation that has an intimate correlation with its Tc. Thus, the Bi oxide superconductor of the invention has its carrier concentration controlled by substituting part of Sr and/or Ca for RE and has its structural modulation relaxed by substituting part of Bi for Pb. Accordingly, the rate of Tc improvement which has been kept low presumably due to structural modulation can be increased, thereby leading to significant Tc improvements. Substitution of alkali earth elements for rare earth elements contributes not only to increasing Tc but also to providing a small dispersion of a normal conductive phase in the superconductor. This has been verified by the fact that the volume fraction of a diamagnetic susceptibility of the superconductor is slightly decreased during such substitution. The dispersed normal conductor phase serves as a pinning site which pins an incident quantum magnetic flux under a high magnetic field, thereby allowing the critical current density to be also improved.

The Bi oxide superconductor according to the invention has an advantage of being prepared at a low oxygen content or in the atmosphere of an inert gas such as pure argon. That is, no active oxygen ions need to be supplied when obtaining the Bi oxide superconductor, even in thin film form or for device fabrication. It is assumed that this is because substitution for Pb and RE element or elements contributes to eliminating superfluous oxygen in a BiO layer that is unstable (weak affinity) in the Bi oxide superconductor and because oxygen in the remaining site has a strong affinity. Therefore, such metal materials as copper and copper alloys that have conventionally been considered unusable due to oxidation or insufficient supply of oxygen to the oxide superconductor during the thermal treatment in the oxygen atmosphere may be used as a coated tube material. The use of these materials even opens the way to obtaining excellent superconducting properties through thermal treatments in an inert gas atmosphere or vacuum.

For the same reason, the oxygen contained in the Bi oxide superconductor that has been prepared is stable, and thus no insulator layer such as AgO will be formed on the interface even when an Ag film is deposited thereon as an electrode. This means that the composition of the superconductor adjacent to its surface is uniform up to the interface, thereby advantageously contributing not only to eliminating interface resistance of the electrode but also to forming proximity-effect-based elements.

The following three types of Bi oxide superconductor are specific examples of the invention.

(1) An oxide superconductor having a composition substantially containing Bi, Pb, Sr, RE, and Cu in an atomic ratio of 2–x:x:a–s:s:b (where about 1.8≦a≦about 2.2; about 0.8≦b≦about 1.2; about 0.01≦s≦about 0.3; and about 0.2≦x≦about 1; with x>s) and a crystal structure of at least one Cu—O plane per unit cell.

A more specific exemplary composition of the above oxide superconductor is represented by the following chemical formula (I).

$$Bi_{2-x}Pb_xSr_{2-s}RE_sCuO_6 \qquad (I)$$

(2) An oxide superconductor having a composition substantially containing Bi, Pb, (Sr,Ca), RE, and Cu in an atomic ratio of 2–x:x:c–m:m:d (where about 2.7≦c≦about 3.2; about 1.8≦d≦about 2.3; about 0.01≦m≦about 0.3; and about 0.2≦x≦about 1; with x>m) and a crystal structure of two Cu—O planes per unit cell.

A more specific exemplary composition of the above oxide superconductor is represented by the following chemical formula (II).

$$Bi_{2-x}Pb_x(Sr,Ca)_{3-m}RE_mCu_2O_8 \qquad (II)$$

(3) An oxide superconductor having a composition substantially containing Bi, Pb, (Sr,Ca), RE, and Cu in an atomic ratio of 2–x:x:e–n:n:f (where about 3.7≦e≦about 4.3; about 2.8≦f≦about 3.3; about 0.01≦n≦about 0.4; and about 0.2≦x≦about 1; with x>n) and a crystal structure of three Cu—O planes per unit cell.

A more specific exemplary composition of the above oxide superconductor is represented by the following chemical formula (III).

$$Bi_{2-x}Pb_x(Sr,Ca)_{4-n}RE_nCu_3O_{10} \qquad (III)$$

The numeral of oxygen in the above formulas (I) to (III) is not necessarily the stoichiometric ratio and may be more or less than the ratio by small amount. The preferred numeral of oxygen is between the ratio+0.2 and the ratio–0.2.

Here the reason why the amount of Bi/Pb substitution is limited to a range from about 0.2 to about 1 for each chemical formula is as follows. The amount x of substitution for Pb below 0.2 does not provide sufficient relaxation of the structural modulation, while x being in excess of 1 makes it difficult to prepare a single phase Bi oxide superconductor. Thus, the preferred amount of Bi/Pb substitution, or x, is between 0.2 and 0.6.

The reason for limiting the amount of substitution of Sr and/or Ca for RE to a range from about 0.01 to about 0.3 in (1), from about 0.01 to about 0.3 in (2), and from about 0.01 to about 0.4 in (3) for each chemical formula is as follows. Amounts of substitution for RE below each minimum do not provide satisfactory effects of carrier concentration adjustment while those above each maximum excessively reduce the carrier concentration, thereby disadvantageously decreasing Tc. The preferred minimum amouts of substitution for RE are 0.05 respectively. The amount of substitution of Sr and/or Ca for RE is from 0.1 to 0.15 in (1) as a value s, from 0.1 to 0.2 in (2) as a value m, and from 0.1 to 0.3 in (3) as a value n.

Preferred modes of substitution of (Sr, Ca) for RE of the Bi oxide superconductors in (2) and (3) are as follows. In substituting Sr, at least one element is selected from the group consisting of La, Nd, Dy, Eu, and Sm. In substituting part of Ca, at least one element is selected from the group consisting of Nd, Pr, Sm, Eu, Gd, Tb, Dy, Ho, Er, Tm, Yb, Lu, and Y. Both Sr and Ca or only one of them may be substituted.

Taking the above into consideration, the preferred compositions of the Bi oxide superconductors in (2) and (3) will be represented by chemical formulas (IV) and (V), respectively. Chemical formula for (2):

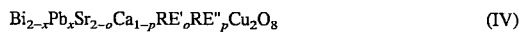

$$Bi_{2-x}Pb_xSr_{2-o}Ca_{1-p}RE'_oRE''_pCu_2O_8 \qquad (IV)$$

(where RE' is at least one rare earth element selected from the group consisting of La, Nd, Dy, Eu, and Sm; RE" is at least one rare earth element selected from the group consisting of Nd, Pr, Sm, Eu, Gd, Tb, Dy, Ho, Er, Tm, Yb, Lu, and Y; $0 \leq o \leq$ about 0.3; $0 \leq p \leq$ about 0.3; about $0.01 \leq o+p \leq$ about 0.3, with $x > o+p$). Chemical formula for (3):

$$Bi_{2-x}Pb_xSr_{2-q}Ca_{2-r}RE'_qRE''_rCu_3O_{10} \qquad (V)$$

(where $0 \leq q \leq$ about 0.3; $0 \leq r \leq$ about 0.3; and about $0.01 \leq q+r \leq$ about 0.4, with $x > q+r$).

The Bi oxide superconductor of the invention may be prepared by, e.g., the following methods.

(a) To prepare it in the form of sintered bodies, single elements such as Bi, Pb (Sr,Ca), RE, and Cu and compounds thereof such as carbonates and oxides thereof are mixed at a predetermined mole fraction. A raw composition is prepared by mixing the starting materials, i.e., the above elements, so that the atomic ratio of either formula (I), (II), or (III) will be satisfied. As long as the atomic ratio of the starting material is within the above described range, the advantage of the invention will be provided. A tolerance of 10% is provided depending on the preparation condition. Then, the above raw composition is tentatively fired in an oxygen atmosphere as necessary, subjected to a thermal treatment at 700° to 900° C. in an inert gas atmosphere including or not including oxygen, and finally sintered.

(b) To prepare it in the form of thin films, a Bi oxide superconductive thin film is formed by a vapor deposition method, a sputtering method, a cluster ion beam method, a molecular beam epitaxy (MBE) method, a chemical vapor deposition method, and the like, using the sintered body obtained by method (a) or the above starting materials.

The superconductive wire or tape using the Bi oxide superconductor of the invention may be prepared by, e.g., the following methods.

A Bi oxide superconductor is prepared as in method (a) and then a Bi oxide superconductive powder is prepared by pulverizing the prepared superconductor. The preferred oxide superconductor is the Bi oxide superconductor prepared by (2) from a stability viewpoint.

The Bi oxide superconductive powder is then used to fill and seal a metal coated tube. A metal coated tube material should be selected so that its mechanical strength, conductivity (required as a stable material), and costs will be appropriate. From the above considerations, copper or a copper alloy such as a copper-nickel alloy are preferred. Stainless tubes may also be applicable.

In using the metal coated tubes described above, it is preferable to form a layer made of a noble metal such as silver and gold over an inner peripheral surface, or a surface of contact with the oxide superconductor. This is to prevent interaction between the oxide superconductor and the tube coating material during thermal treatment, thereby allowing excellent superconductivity to be obtained.

The metal coated tube having the above noble metal layer may be prepared by, e.g., a mechanical forming method in which a thin silver tube is inserted into the coated metal and drawn; a thin film forming method such as a plating method; or a liquid coating method.

Thereafter, the metal coated tube which has been filled by the Bi oxide superconductive powder is processed into a desired wire or tape shape by, e.g., a surface reducing or wire drawing process, subjected to a thermal treatment for property improvement to obtain the desired superconductive wire or tape.

The thermal treatment should preferably be carried out in the atmosphere of an inert gas such as nitrogen or argon, or in a vacuum to prevent deterioration of the metal coated tube. The superconductive wire or tape using the Bi oxide superconductor of the invention exhibits excellent superconductivity even during the thermal treatment in the above-described atmosphere. For example, for a metal coated tube consisting, e.g., of copper or a copper alloy, it is preferable to limit the oxygen content in the atmosphere below 1000 ppm, although this also depends on the thermal treatment temperature, which is preferably adjusted to about 750° to 900° C. The thermal treatment under the above conditions provide satisfactory effects also in case of preparing, e.g., a coil even if it is carried out after winding the coil into a predetermined shape.

According to the invention, the Bi oxide superconductor has not only its carrier concentration controlled but also its structural modulation relaxed, and this contributes to greatly improving its Tc. In addition, an increase in Tc of the Bi oxide superconductor whose structure is suitable for easy preparation, a stable preparation in a low oxygen content, a stable surface condition of the prepared superconductor, and the like provide an oxide superconductor that can be a strong potential as superconductive devices and superconductive wires and tapes. Moreover, the Bi oxide superconductor of the invention with its dispersed normal conductive phase acting as a pinning site provides improvements in critical current density.

DESCRIPTION OF THE PREFERRED EMBODIMENTS

Embodiments of the invention will be described.

Example 1 and Comparative Example 1

The Bi oxide superconductive thin films represented by formula (I) was prepared by the MBE method as follows.

A crucible accommodating Bi, Pb, Sr, RE (Nd, La, or Sm), and Cu, which were deposition sources, was arranged within a vacuum container of an MBE device, and an MgO substrate was set to a substrate holder and heated to about 400° to 500° C. by a heater. Then, the vacuum container was first evacuated roughly to a high vacuum degree and then finely adjusted so that an oxygen atmosphere of about $1 \times 10^{-3}$ Torr can be obtained therein. Under such condition, each deposition source was heated to a temperature commensurate with its evaporation temperature to start film formation, and the 1000 nm thick Bi oxide superconductive thin films of the compositions shown in Table 1 were produced. The MBE condition was adjusted so that the films of respective compositions can be prepared.

The superconducting properties of the thus prepared Bi oxide superconductive thin films were evaluated by means of a dc four probe method and through magnetization measurement by a SQUID magnetometer. The result is also shown in Table 1. Further, when Meissner effect in 4.2K of every thin film is measured, superconductivity in every thin film is confirmed.

Exemplary films that were not Pb-substituted or were Pb-substituted by small amount were prepared for comparison purposes (Comparative Example 1). The data on these films are also shown in Table 1. No single phase thin film was produced when the amount x of substitution of Pb was greater than 1.

TABLE 1

| | Sample No. | Composition | $T_c$ |
|---|---|---|---|
| Example 1 | 1 | $Bi_{1.8}Pb_{0.2}Sr_{1.9}Nd_{0.1}CuO_6$ | 40K |
| | 2 | $Bi_{1.6}Pb_{0.4}Sr_{1.8}Nd_{0.2}CuO_6$ | 50K |
| | 3 | $Bi_{1.5}Pb_{0.5}Sr_{1.9}Nd_{0.2}CuO_6$ | 55K |
| | 4 | $Bi_{1.4}Pb_{0.6}Sr_{1.8}Nd_{0.2}CuO_6$ | 60K |
| | 5 | $Bi_{1.0}Pb_{1.0}Sr_{1.7}Nd_{0.3}CuO_6$ | 80K |
| | 6 | $Bi_{1.8}Pb_{0.2}Sr_{1.9}La_{0.1}CuO_6$ | 42K |
| | 7 | $Bi_{1.8}Pb_{0.2}Sr_{1.9}Sm_{0.1}CuO_6$ | 40K |
| | 8 | $Bi_{1.4}Pb_{0.6}Sr_{1.9}La_{0.1}CuO_6$ | 57K |
| Comparative example 1 | 1 | $Bi_2Sr_2CuO_6$ | 6K |
| | 2 | $Bi_{1.9}Pb_{0.1}Sr_2CuO_6$ | 10K |

Example 2 and Comparative Example 2

The Bi oxide superconductive thin films represented by formula (II) were prepared by the MBE method in a manner similar to that in Example 1. The compositions of the thin films are as shown in Table 2. These films were subjected to superconductivity evaluation, the result of which is also shown in Table 2. Further, when Meissner effect in 4.2K of every thin film is measured, superconductivity in every thin film is confirmed.

TABLE 2

| | Sample No. | Composition | $T_c$ |
|---|---|---|---|
| Example 2 | 1 | $Bi_{1.8}Pb_{0.2}Sr_{1.9}Nd_{0.1}Ca_1Cu_2O_8$ | 92K |
| | 2 | $Bi_{1.7}Pb_{0.3}Sr_{1.9}Nd_{0.1}Ca_{0.9}Y_{0.1}Cu_2O_8$ | 95K |
| | 3 | $Bi_{1.7}Pb_{0.3}Sr_2Ca_{0.8}Y_{0.2}Cu_2O_8$ | 99K |
| | 4 | $Bi_{1.5}Pb_{0.5}Sr_{1.9}Eu_{0.1}Ca_{0.9}Y_{0.1}Cu_2O_8$ | 101K |
| | 5 | $Bi_{1.6}Pb_{0.4}Sr_{1.9}Sm_{0.1}Ca_{0.8}Y_{0.2}Cu_2O_8$ | 95K |
| | 6 | $Bi_{1.6}Pb_{0.4}Sr_2Ca_{0.8}Y_{0.2}Cu_2O_8$ | 99K |
| | 7 | $Bi_{1.0}Pb_{1.0}Sr_{1.9}Eu_{0.1}Ca_{0.8}Y_{0.2}Cu_2O_8$ | 90K |
| | 8 | $Bi_{1.2}Pb_{0.8}Sr_2Ca_{0.7}Y_{0.3}Cu_2O_8$ | 89K |
| Comparative example 2 | 1 | $Bi_2Sr_2Ca_1Cu_2O_8$ | 70K |
| | 2 | $Bi_{1.8}Pb_{0.2}Sr_2Ca_1Cu_2O_8$ | 78K |
| | 3 | $Bi_{1.7}Pb_{0.3}Sr_2Ca_1Cu_2O_8$ | 86K |

Example 3 and Comparative Example 3

The Bi oxide superconductive thin films represented by formula (III) were prepared by the MBE method in a manner similar to that in Example 1. The compositions of the thin films are as shown in Table 3. These films were subjected to superconductivity evaluation, the result of which is also shown in Table 3. Further, when Meissner effect in 4.2K of every thin film is measured, superconductivity in every thin film is confirmed.

TABLE 3

| | Sample No. | Composition | $T_c$ |
|---|---|---|---|
| Example 3 | 1 | $Bi_{1.8}Pb_{0.2}Sr_{1.9}Nd_{0.1}Ca_2Cu_3O_{10}$ | 112K |
| | 2 | $Bi_{1.7}Pb_{0.3}Sr_{1.9}Nd_{0.1}Ca_{1.9}Y_{0.1}Cu_3O_{10}$ | 113K |
| | 3 | $Bi_{1.7}Pb_{0.3}Sr_2Ca_{1.8}Y_{0.2}Cu_3O_{10}$ | 112K |
| | 4 | $Bi_{1.5}Pb_{0.5}Sr_{1.9}Eu_{0.1}Ca_{1.9}Y_{0.1}Cu_3O_{10}$ | 113K |
| | 5 | $Bi_{1.6}Pb_{0.4}Sr_{1.9}Sm_{0.1}Ca_{1.8}Y_{0.2}Cu_3O_{10}$ | 111K |
| Comparative example 3 | 1 | $Bi_2Sr_2Ca_2Cu_3O_{10}$ | 105K |
| | 2 | $Bi_{1.8}Pb_{0.2}Sr_2Ca_2Cu_3O_{10}$ | 103K |
| | 3 | $Bi_{1.7}Pb_{0.3}Sr_2Ca_2Cu_3O_{10}$ | 101K |

Example 4

A superconductor having the composition of $Bi_{1.6}Pb_{0.4}Sr_{1.9}Nd_{0.1}Ca_{0.9}Y_{0.1}Cu_2O_8$ was prepared by a solid state reaction method, from which a Bi oxide superconductive thin power of the above composition was produced. Then, the powder was compressed and subjected to a hot press process in a $N_2$ atmosphere to prepare a sintered body. The hot press conditions are 100 kg/cm$^2$ and 780° C. for 20 hours.

A 1-mm$^2$ sample piece was cut off from the above sintered body and subjected to critical current density measurement in a magnetic field. The obtained value was as good as $3\times10^4$ A/cm$^2$ at 77K in a magnetic field of 5T. Further, when Meissner effect in 4.2K of the above-mentioned samples is measured, superconductivity is confirmed.

Comparative Example 4

Superconductor samples respectively composed of $Bi_2Sr_2Ca_1Cu_2O_8$, $Bi_{1.6}Pb_{0.4}Sr_2Ca_1Cu_2O_8$, $Bi_2Sr_2Ca_{0.8}Y_{0.2}Cu_2O_8$ were prepared as in Example 4 and similarly subjected to critical current density in the magnetic field. The obtained values were only as small as $1\times10^2$, $8\times10^2$, and $6\times10^2$ A/cm$^2$.

Example 5/Comparative Example 5

A superconductive thin film composed of $Bi_{1.6}Pb_{0.4}Sr_{1.8}Nd_{0.2}Ca_{0.9}Y_{0.1}Cu_2O_8$ was prepared as in Example 2, and an Ag film of an area with a diameter of 1 mm was vapor deposited on the film. The thus processed film was subjected to a thermal treatment at 500° C. for 2 hours, and thereafter subjected to interface resistance measurement. The obtained value was as good as $2\times10^{-8}$ Ω.

For purposes of comparison, superconductive thin films respectively composed of $Bi_2Sr_2Ca_1Cu_2O_8$, $Bi_{1.6}Pb_{0.4}Sr_2Ca_1Cu_2O_8$ were prepared as in Example 5, were similarly subjected to Ag film vapor deposition and thermal treatment, and interfacial resistance measurement at 20K. The obtained values were only as small as $3\times10^{-2}$ and $5\times10^{-5}$ Ω.

It is understood from the above data that the superconductive thin films, with a satisfactorily low interface resistance junction, have stable surface conditions and have no interfacial product such as AgO which would be obtained through interaction with Ag.

Example 6

Powders of $Bi_2O_3$, PbO, $SrCO_3$, $La_2O_3$, $CaCO_3$, $Y_2O_3$, and CuO were prepared as starting materials and weighed so that the atomic ratio of their cations will satisfy Bi:Pb:Sr:La:Ca:Y:Cu=1.5:0.5:1.9:0.1:0.9:0.1:2, and they were mixed sufficiently. Then, the above mixed power was temporarily fired in air at 780° C. for 24 hours, pulverized in a ball mill to obtain a Bi oxide superconductive powder composed of $Bi_{1.5}Pb_{0.5}Sr_{1.9}La_{0.1}Ca_{0.9}Y_{0.1}Cu_2O_8$.

Then, a copper tube having a thin silver tube inside is prepared to fill the Bi oxide superconductive powder of the above composition therein. The filled superconductive powder was drawn and rolled to prepare a tape-like strip of 6 mm in width and 0.4 mm in thickness. Thereafter, the type-like strip was subjected to a thermal treatment at 800° C. for 100 hours to obtain the desired tape-like superconductive strip.

The superconductivity of the thus prepared strip was evaluated, the result of which was favorable: a Tc of 94K and a critical current density of $3\times10^5$ A/cm$^2$. Further, when Meissner effect in 4.2K of the above-mentioned tape-like strip is measured, superconductivity is confirmed.

Comparative Example 6

A Bi oxide superconductive powder composed of $Bi_2Sr_2Ca_1Cu_2O_8$ was prepared as in Example 6 by the solid phase reaction method and a tape-like strip was similarly formed therefrom and subjected to the same thermal treatment. The thus prepared strip was subjected to superconductive analyses and exhibited no superconductivity even if it was cooled to liquid helium temperature.

Comparative Example 7

When a tape-like strip prepared as in Comparative example 6 was subjected to a thermal treatment in an oxygen atmosphere, no samples qualified for superconductivity measurement were obtained because the copper, which was a sheath material, had been oxidized.

What is claimed is:

1. An oxide superconductor comprising a composition represented by a chemical formula:

$$Bi_{2-x}Pb_xSr_{2-s}RE_sCuO_{6+\delta}$$

wherein RE is at least one rare earth element selected from the group consisting of La, Nd, Pr, Sm, Eu, Gd, Tb, Dy, Ho, Er, Tm, Yb, Lu, and Y and wherein x, s and $\delta$ are defined as follows: $0.2 \leq x \leq 1.0$, $0.05 \leq s \leq 0.3$, $-0.2 \leq \delta \leq 0.2$, and the ratio x/s is at least about 1.5.

2. The oxide superconductor according to claim 1, wherein said oxide superconductor has a composition represented by the chemical formula: $Bi_{2-x}Pb_xSr_{2-s}RE_sCuO_6$.

3. An oxide superconductor comprising a composition represented by the chemical formula:

$$Bi_{2-x}Pb_x(Sr,Ca)_{4-n}RE_nCu_3O_{10+\delta},$$

wherein RE is at least one rare earth element selected from the group consisting of La, Nd, Pr, Sm, Eu, Gd, Tb, Dy, Ho, Er, Tm, Yb, Lu, and Y and wherein x, n and $\delta$ are defined as follows: $0.2 \leq x \leq 1.0$, $0.05 \leq n \leq 0.4$, $-0.2 \leq \delta \leq 0.2$, and the ratio x/n is at least about 1.5.

4. An oxide superconductor according to claim 3, wherein said oxide superconductor has a composition represented by the chemical formula:

$$Bi_{2-x}Pb_x(Sr, Ca)_{4-n}RE_nCu_3O_{10}.$$

5. An oxide superconductor according to claim 3, wherein $0.1 \leq n \leq 0.3$ and $0.2 \leq x \leq 0.6$.

6. An oxide superconductor having the formula:

$$Bi_{2-x}Pb_xSr_{a-s}RE_sCu_bO_{6+\delta},$$

wherein RE is at least one rare earth element selected from the group consisting of La, Nd, Pr, Sm, Eu, Gd, Tb, Dy, Ho, Er, Tm, Yb, Lu, and Y and wherein $1.8 \leq a \leq 2.2$, $0.8 \leq b \leq 1.2$, $0.1 \leq s \leq 0.3$, $0.2 \leq x \leq 1$, $-0.2 \leq \delta 0.2$, and the ratio of x/s is at least about 1.5.

7. An oxide superconductor having the formula:

$$Bi_{2-x}Pb_x(Sr,Ca)_{e-n}RE_nCu_fO_{10+\delta},$$

wherein RE is at least one rare earth element selected from the group consisting of La, Nd, Pr, Sm, Eu, Gd, Tb, Dy, Ho, Er, Tm, Yb, Lu, and Y and wherein $3.7 \leq e \leq 4.3$, $2.8 \leq f \leq 3.3$, $0.05 \leq n \leq 0.4$, $0.2 \leq x \leq 1$, $-0.2 \leq \delta \leq 0.2$, and the ratio of x/n is at least about 1.5.

* * * * *

UNITED STATES PATENT AND TRADEMARK OFFICE
CERTIFICATE OF CORRECTION

PATENT NO. : 5,508,252
DATED : April 16, 1996
INVENTOR(S) : Noburu FUKUSHIMA et al It is certified that error appears in the above-identified patent and that said Letters Patent is hereby corrected as shown below:

Column 2, line 23, "stabile" should read --stable--.
Column 4, line 8, "$2.7 \leq c \geq$ about" should read --$2.7 \leq c \leq$ about--;
　　　　　　line 49, "amouts" should read --amounts--.
Column 5, line 2, "consisting La," should read --consisting of La,--.
Column 8, line 1, "thin power" should read --thin powder--;
　　　　　　line 52, "power" should read --powder--.
Column 10, line 21, "$-0.2 \leq \delta 0.2$" should read ---$0.2 \leq \delta \leq 0.2$--.

Signed and Sealed this

Thirty-first Day of December, 1996

Attest:

BRUCE LEHMAN

*Attesting Officer*　　　*Commissioner of Patents and Trademarks*